(12) United States Patent
Wan (10) Patent No.: US 7,952,189 B2
(45) Date of Patent: May 31, 2011

(54) HERMETIC PACKAGING AND METHOD OF MANUFACTURE AND USE THEREFORE

(76) Inventor: Chang-Feng Wan, Dallas, TX (US)

( * ) Notice: Subject to any disclaimer, the term of this patent is extended or adjusted under 35 U.S.C. 154(b) by 0 days.

(21) Appl. No.: 11/113,545

(22) Filed: Apr. 25, 2005

(65) Prior Publication Data

US 2005/0263866 A1 Dec. 1, 2005

Related U.S. Application Data

(60) Provisional application No. 60/626,065, filed on Nov. 8, 2004, provisional application No. 60/607,723, filed on Sep. 7, 2004, provisional application No. 60/575,586, filed on May 27, 2004.

(51) Int. Cl.
*H01L 23/12* (2006.01)
(52) U.S. Cl. ............ 257/704; 257/710; 257/E23.193
(58) Field of Classification Search ............ 257/704; 438/125
See application file for complete search history.

(56) References Cited

U.S. PATENT DOCUMENTS

| | | | | |
|---|---|---|---|---|
| 6,929,974 | B2 * | 8/2005 | Ding et al. | 438/106 |
| 6,932,522 | B2 * | 8/2005 | Zhou | 385/94 |
| 6,982,475 | B1 * | 1/2006 | MacIntyre | 257/620 |
| 2002/0000649 | A1 * | 1/2002 | Tilmans et al. | 257/678 |
| 2003/0089394 | A1 * | 5/2003 | Chang-Chien et al. | 137/14 |
| 2004/0012838 | A1 * | 1/2004 | Huibers | 359/291 |
| 2004/0140475 | A1 * | 7/2004 | Sun et al. | 257/100 |
| 2005/0258516 | A1 * | 11/2005 | Hong et al. | 257/659 |

* cited by examiner

*Primary Examiner* — Ajay K Arora (57) ABSTRACT

An embodiment of the present invention provides a method of manufacturing hermetic packaging for devices on a substrate wafer, comprising forming a plurality of adhesive rings on a cap wafer or the substrate wafer, bonding the cap wafer to the substrate wafer with an adhesive layer, forming trenches in the cap wafer and the adhesive rings along outer rim of the adhesive rings, and covering sidewall of the trenches by at least one deposited film to provide a diffusion barrier to moisture or gas.

17 Claims, 16 Drawing Sheets

HERMETIC PACKAGING AND METHOD OF MANUFACTURE AND USE THEREFORE

CROSS-REFERENCE TO RELATED APPLICATIONS

This claims the benefit of the following provisional patents: filed May 27, 2004 (APPL No. 60/575,586), filed Sep. 7, 2004 (APPL No. 60/607,723), and filed Nov. 8, 2004 entitled, "METHOD OF MANUFACTURING HERMETIC PACKAGING" (60/626,065).

BACKGROUND

Hermetic packaging, which provides tightly sealed cavities, has been used to protect many MEMS (micorelectromechnaical systems), such as optical, RF (radio frequency) and sensor devices, against moisture and other corrosive gases from seeping in, or to keep under controlled atmosphere. Specific examples include DLP™, bolometer, accelerometers and gyroscope. Wafer-level packaging offers advantages for packaging of cavities brings the cost advantage of simultaneously sealing an entire wafer of cavities. This eliminates the manufacturing inefficiencies and the costs of individual "pump down and pinch off" for archaic metal or ceramic packages. These potential cavity package advantages have sparked many development efforts for wafer-scale hermetic cavity packaging. The earliest cavity wafer-level packaging to be produced in large quantities were for protecting MEMS devices with moving surface elements. Millions of automotive airbag systems are today controlled by MEMS accelerometers residing in hermetic cavity wafer-level packages. More recently, cavity non-hermetic wafer-level packaging support high-volume consumer applications, such as digital cameras. Controlled-atmosphere hermetic cavity wafer-level packaging are currently being offered for MEMS RF switches. Further developments aim at size, weight and cost reductions for limited-lifetime products, or at economically meeting the more stringent requirements of high-performance, long-lifetime MEMS, optical devices and sensors.

Since cavity wafer-level packaging by their nature are generally precluded from adding layers over the active devices on the wafer surface, cavity packages are created either by bonding a second wafer with pre-formed cavities over the device wafer (wafer stacking) or by dicing the second wafer and bonding the individual cavity chips onto the device wafer (chip-on-wafer).

The present invention relates to manufacturing hermetic packaging cavities at the wafer level by wafer bonding and forming enclosures that is impervious to moisture or ambient gas. One approach to fabricating a wafer-level cavity package is to use epoxy to bond a cap wafer with a stenciled wafer for forming open cavities on one side first. Then this wafer is likewise bonded and sealed to the substrate wafer that contains MEMS devices (such as DLP™, accelerometers), thereby sealing numerous MEMS devices on the substrate wafer in enclosure cavities. This approach is very simple and cost effective. However, because of the permeability and possible out-gassing of the epoxy seals, the package is classified as non-hermetic. Another approach is to enclose the MEMS devices in deposited film using a sacrificial layer as temporary support, which is subsequently removed by etching through small holes in the deposited films, which is in turn sealed with deposited film. This approach is only suitable for very small devices because the films are much thinner than the cap wafers made from bulk material.

SUMMARY OF THE INVENTION

An embodiment of the present invention provides a method for manufacturing hermetic packages on wafer scale. It may use surface micromachining technique to fabricate the packaging. The technique may employ polymer bonding and thin film deposition to package MEMS or other devices under controlled atmosphere. They are impervious to moisture and gases and may be fabricated at low temperatures.

DETAILED DESCRIPTION

A method and system for cavity packaging MEMS devices, such as the DLP™ (digital light processor) on wafer scale in hermetic or vacuum seal is described herein. The processes of the wafer-level packaging begin during or after the final phase of the MEMS device fabrication process, and before the wafer are diced into separate chips. Referring now to FIGS. 1 to 9, there is a depicted cross-sectional view showing a particular portion of a microstructure during specific phases of the packaging process for the exemplary MEMS device. The dimensions are not shown to scale.

Figure 1A:
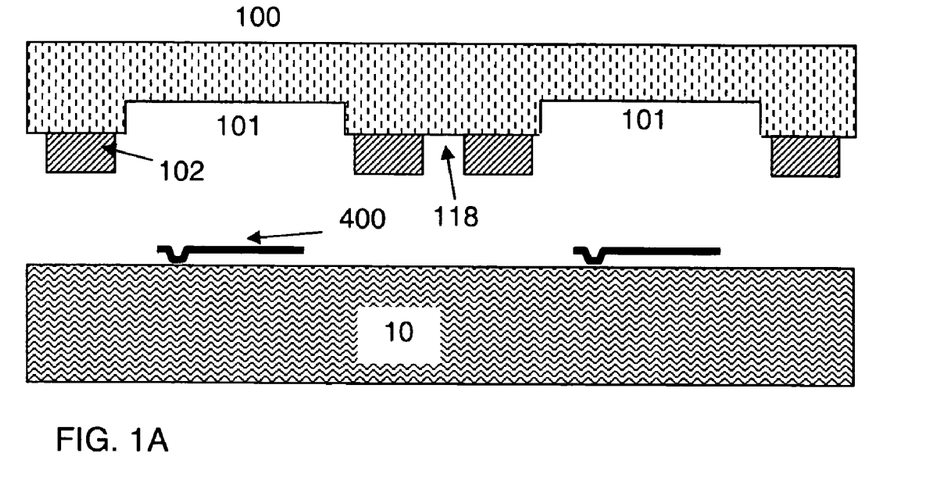
FIGS. 1 through 9 depict cross-sectional side views and their associated perspective views, showing a particular portion of a microstructure during specific phases of the wafer-level hermetic or vacuum packaging process for a MEMS device.
Figure 1B:
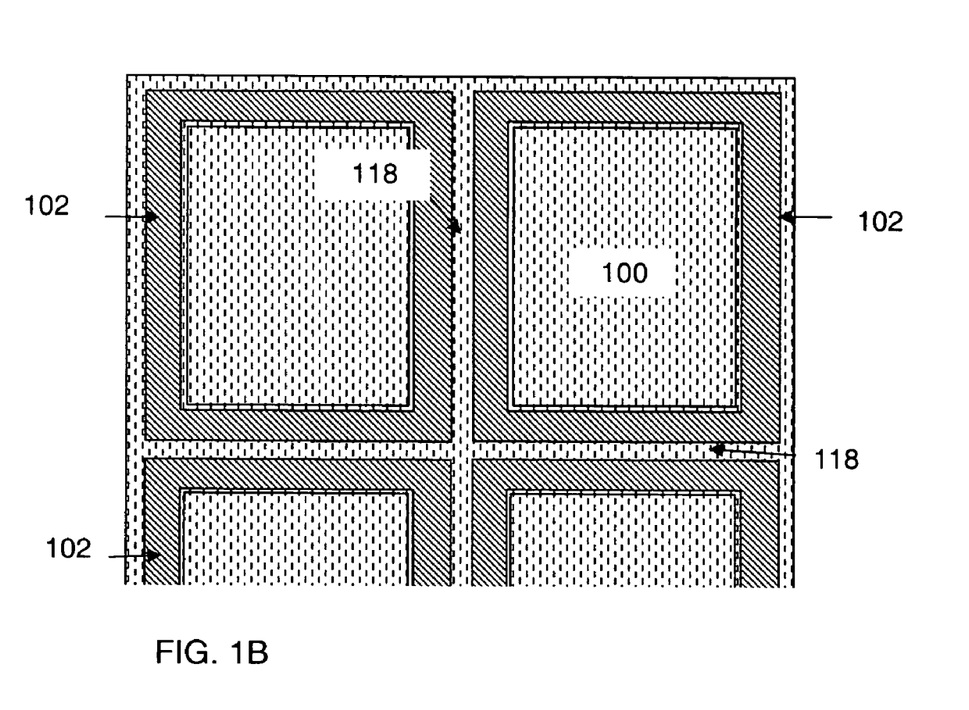
Figure 2A:
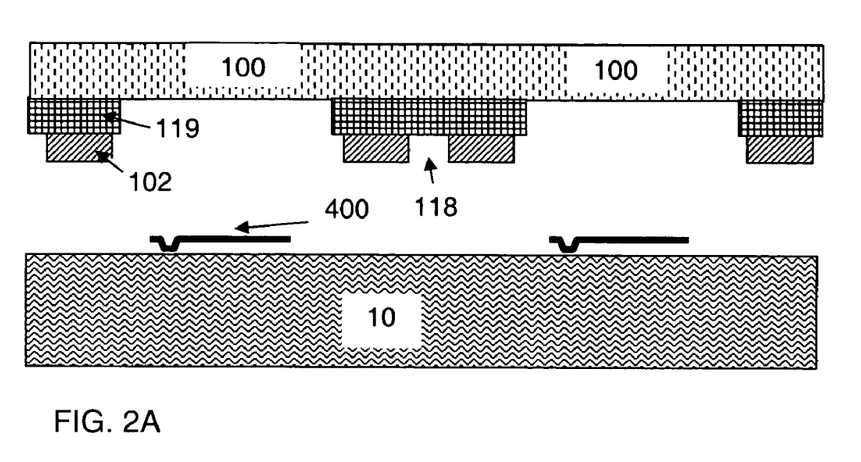
Figure 2B:
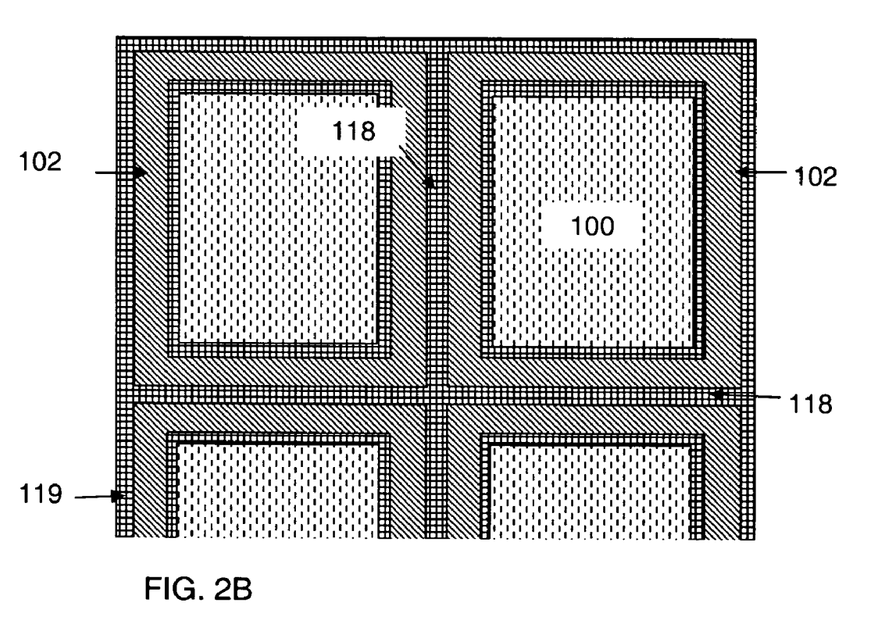

FIG. 1A depicts cross-sectional view of a microelectronics substrate 10, which comprises micromechanical structures 400, and a cap wafer 100. A plurality of adhesive rings 102, with gap 118 between them, are formed on the cap wafer 100, as shown in plain view of FIG. 1B. Alternatively the adhesive rings may be formed on the substrate wafer 10. The cap wafer 100 may have cavities 101 etched thereon and is preferable made of glass or silicon. FIG. 1B depicts plain view of the cap wafer 100 from its underside, whereon an array of adhesive rings 102 are formed. The adhesive rings 102 comprise an adhesive polymer. They are formed by patterning a layer of adhesive polymer (such as Benzocyclobutene, polyimide, photoresist, and epoxy) by photolithography, screen printing, inkjet printing, or by applying with liquid dispenser. Thus the adhesive rings 102 form a spacer as well as adhesive. The adhesive polymer may be sparingly filled with solid spheres or sticks or gas getter such as zeolite and Staystik Referring to cross sectional view of FIG. 2A, an additional spacer 119 may be formed on the cap wafer prior to forming the adhesive rings 102. This can be done by bonding a stenciled wafer to the cap wafer 100 or by coating and patterning a layer of polymer on the cap wafer 100. The bonding of the stenciled wafer may be done with a thin layer of epoxy or other wafer bonding methods such as anodic bonding. Cross sectional view of cap wafer 100 with the additional spacer 119 and adhesive rings 102 is shown in FIG. 2A, whose plan view is shown in FIG. 2B. It should be noted that the adhesive rings 102 and/or the spacer 119 can be formed on the substrate wafer 10 instead of the cap wafer 100.

Figure 3A:
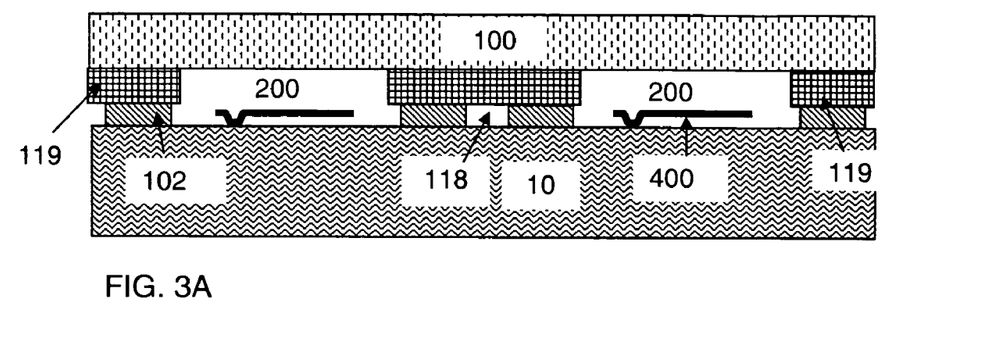
Figure 3B:
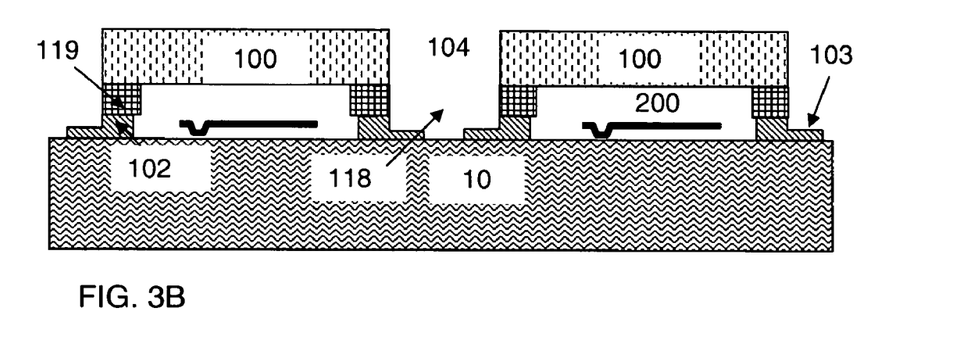
Figure 3C:
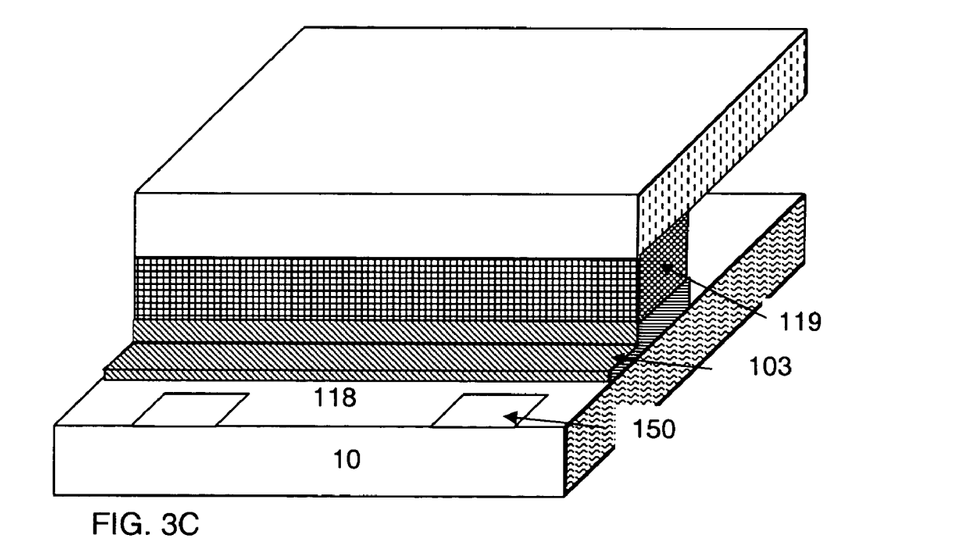
Figure 3D:
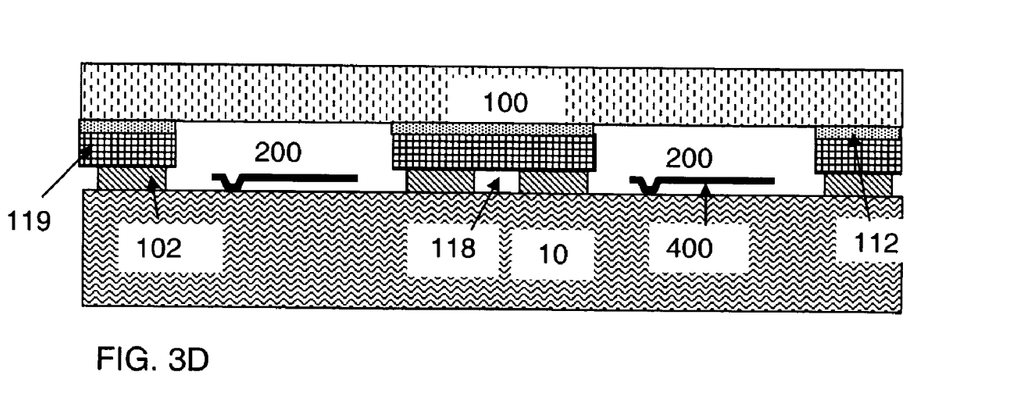
Figure 3E:
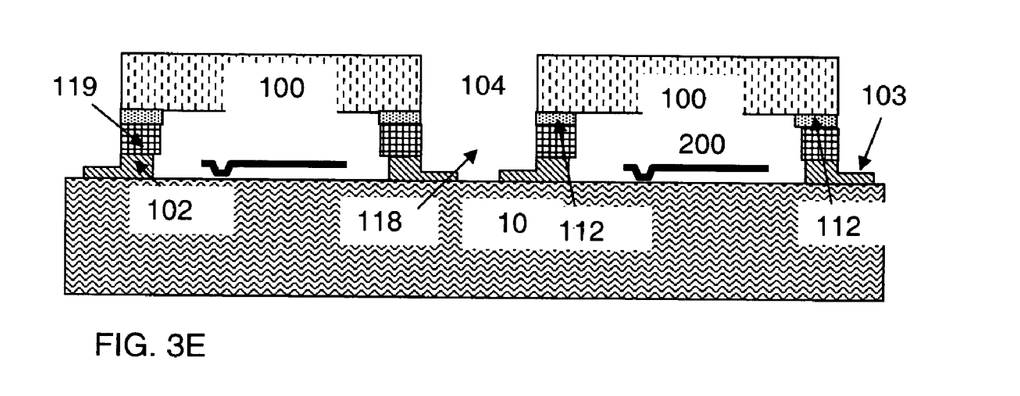
Figure 4A:
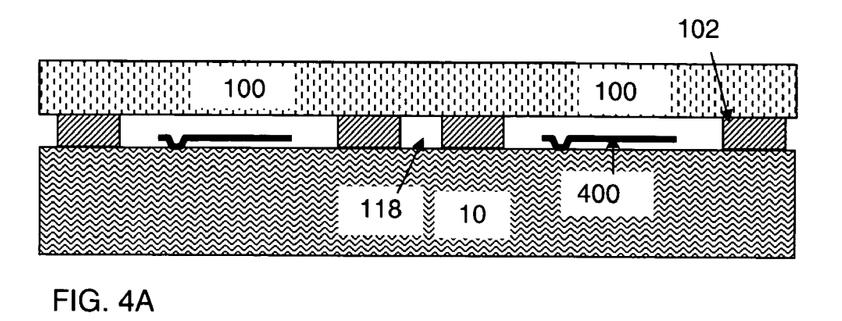
Figure 4B:
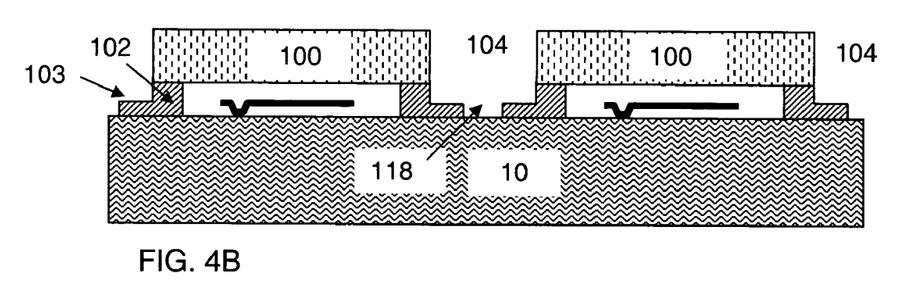
Figure 4C:
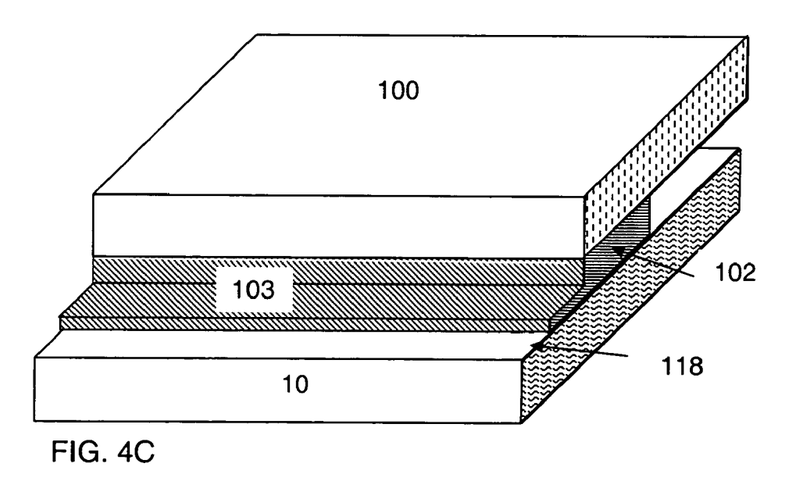

Reference is now made to cross sectional view of FIG. 3A, cap wafer 100 and substrate wafer 10 are aligned and bonded together by bringing them into contact with each other, placed under pressure, vacuum, UV light, and/or heat so that the adhesive rings 102 bond the two wafers together. Thus the micromechanical structure 400 is enclosed in a closed cavity enclosure 200 that are bounded by the cap wafer 100, substrate wafer 10, the adhesive rings 102 and the spacer 119, as shown in FIG. 3A. Next trenches 104 are formed along the outer rims of the adhesive rings 102 by etching and/or sawing with a depth that cuts through the cap wafer 100, the spacer 119, if any, and partially into the adhesive ring 102. The width of the trenches 104 spans from within the adhesive ring to within the gap 118. This creates a shoulder 103 on the outer rims of the adhesive ring 102 and opens the gaps 118 to the air, as shown in cross sectional view of FIG. 3B and perspective view of FIG. 3C. If the spacer 119 is made from a stenciled wafer with cut-outs and is bonded to the cap wafer 100 with an epoxy 113, there are two polymer layers, as shown in FIG. 3D. The trenches 104 are formed to totally cut through the cap wafer 100, the epoxy 113, and the spacer 119, ending in the polymer rings 102, as shown in FIG. 3E. In case spacer 119 is not present or is made of a polymer, the micromechanical structures 400 are enclosed in cavities bounded by cap wafer 100, substrate wafer 10, and polymer rings 102, as shown in FIG. 4A. Trenches 104 are formed along the outer rims of the polymer rings 102 through the cap wafer 100, and partially through the polymer rings 102, forming shoulders 103 on the outer edge of the polymer rings 102 or the cap wafer 100, and exposing the gaps 118, as shown in FIG. 4B. A perspective view of a portion of trench 104 is shown in FIG. 4C.

Figure 4D:
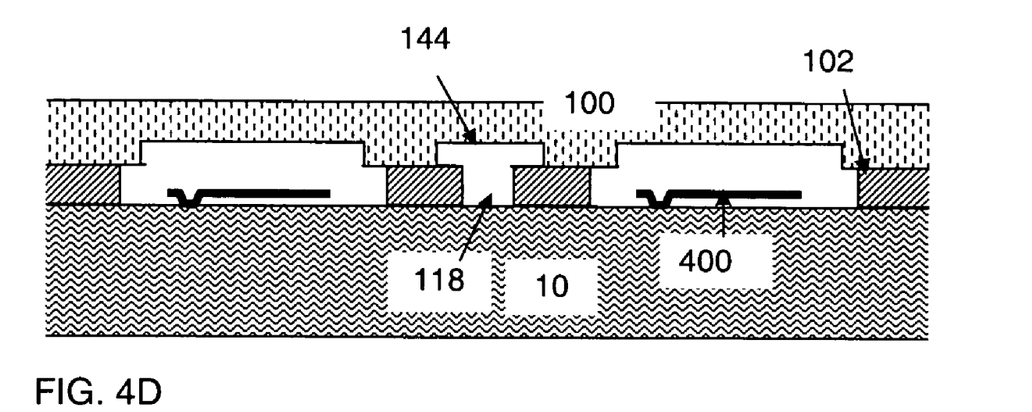
Figure 4E:
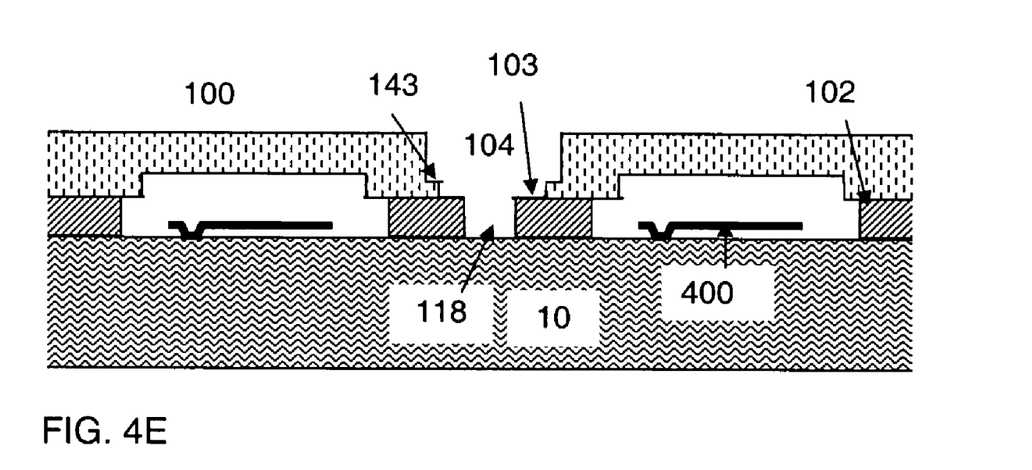
Figure 4F:
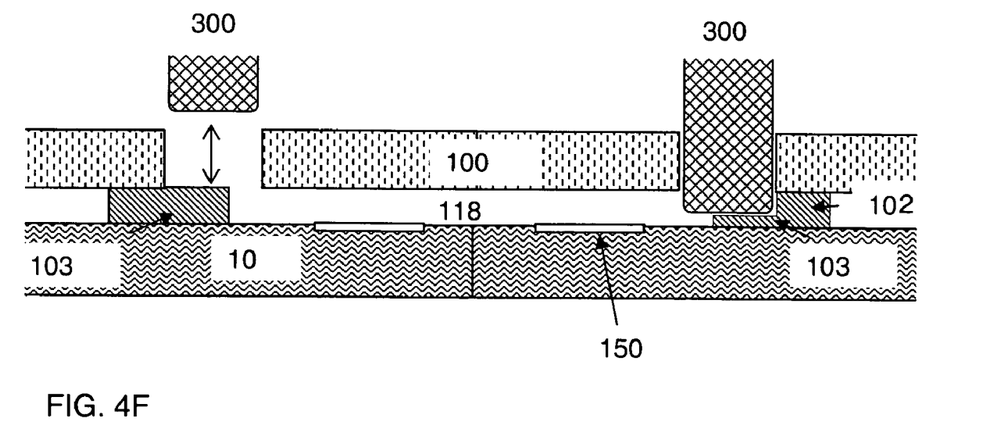

Notches 144 may be formed in the cap wafer 100 between cavities along the gap 118 prior to bonding, as shown in FIG. 4D to aid the trench 104 formation. Trenches 104 are then formed over the notches 144, as shown in FIG. 4E, where shoulders 143 are formed in on the trench-side edge of the cap 100, in addition to the shoulders 103 formed on polymer ring 102.

Figure 4G:
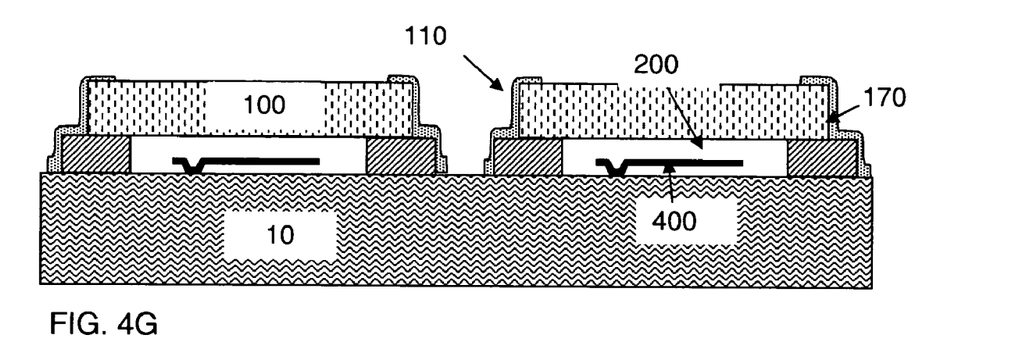

Formation of trench 104 is preferably done by sawing or etching. Sawing is preferred when cap wafer is a thick glass, which is more difficult to etch. Sawing can be done with a dicing saw 300 along the outer edge of the adhesive or polymer rings 102, as shown in cross-sectional view FIG. 4F, where depth of trench 104 is controlled such that the cap wafer 100 is cut through and gap 118 and polymer rings 102 are exposed to the opening. As mentioned before, this creates a shoulder 103 on the outer edge of the polymer ring 102 or cap wafer 100, and substrate surface including the bondpads 150 in gap 118 are exposed to the opening and that the polymer rings 102 extends beyond the cap wafer 100. This creates a shoulder 103 on the sidewall of the enclosure, and also exposes the gap 118 along with the substrate surface where the bondpads 150 lie. Needless to say, the bondpads are electrically connected to the MEMS device 400 in the enclosure 200. One potential problem during forming the trench is that it may create jagged edges on the cap wafer 100 or the spacer 119. The jagged edges and voids in the polymer wafer bonding may form crevices or voids on the sidewall of the trench 104. They can prevent full coverage of the polymer sidewall during deposition of the diffusion-barrier layer. The crevices or voids on the sidewall can be filled with a sidewall coating 170 formed from spin-cast film such as epoxy, photoresist, spin-on glass and/or deposited film such as CVD oxide and Parylene as shown in FIG. 4G. The sidewall. coating 170 can also be formed with a self-aligned process similar to the sidewall spacers used in CMOS LDD (lightly doped drain) gate structure.

Figure 5A:
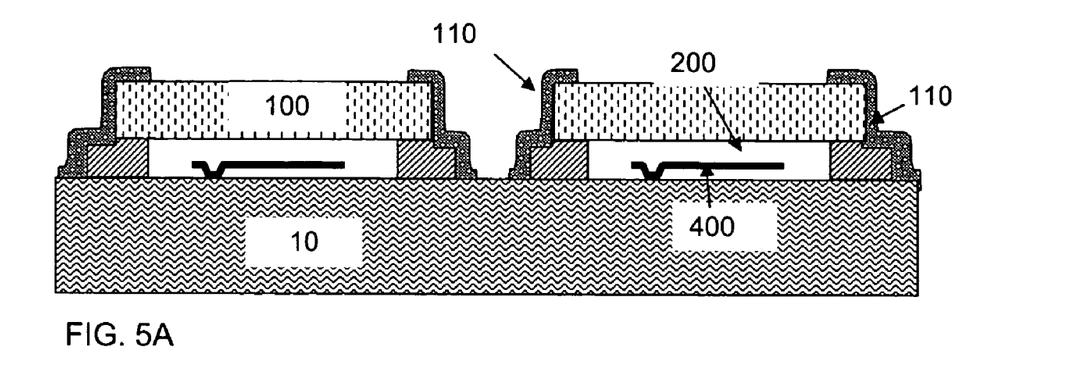
Figure 5B:
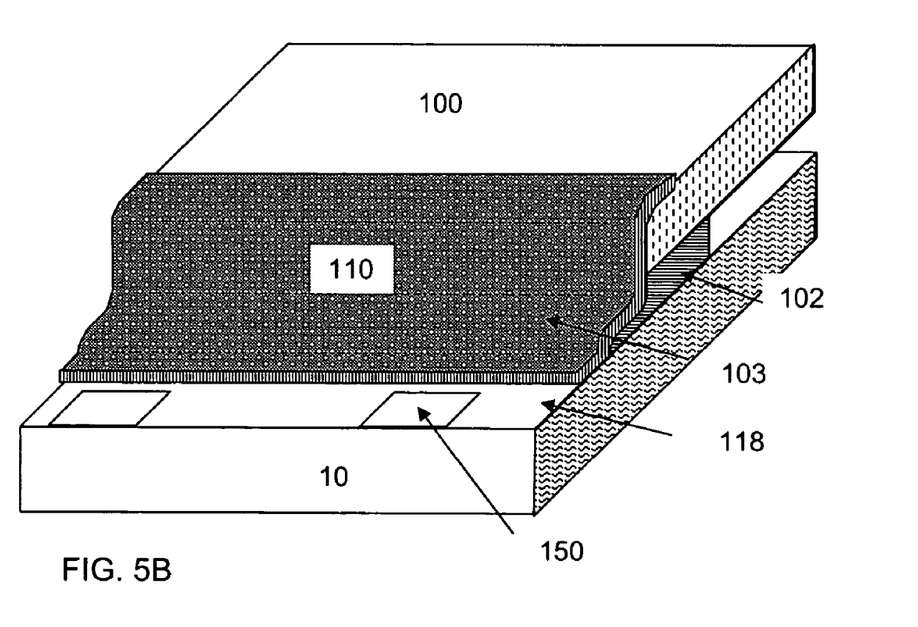
Figure 6A:
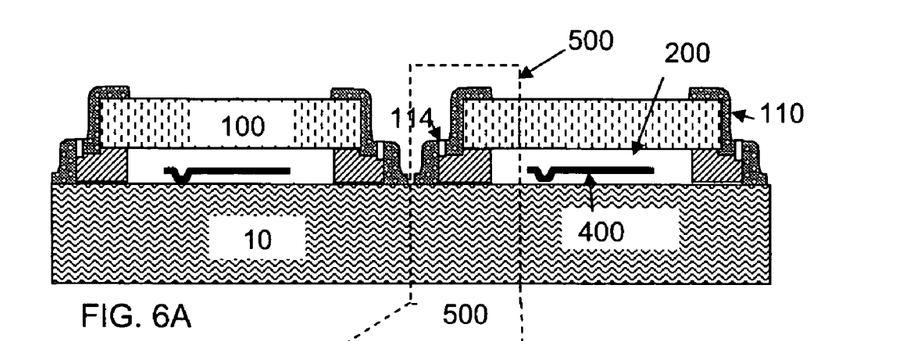
Figure 6B:
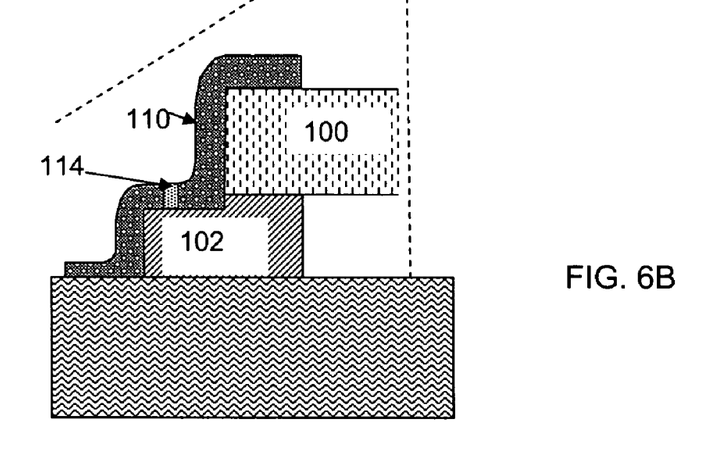
Figure 6C:
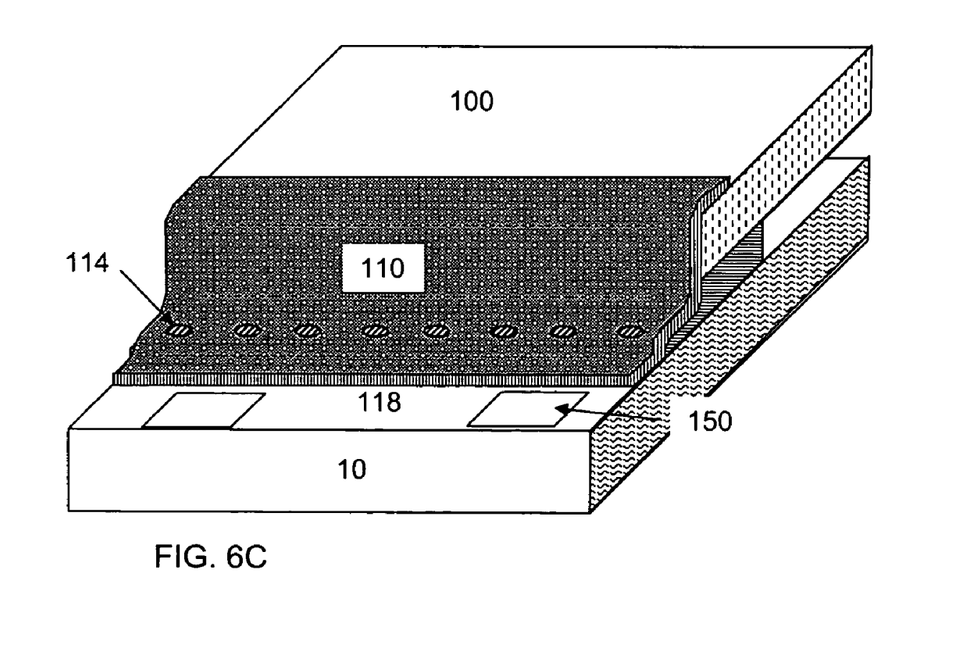
Figure 7A:
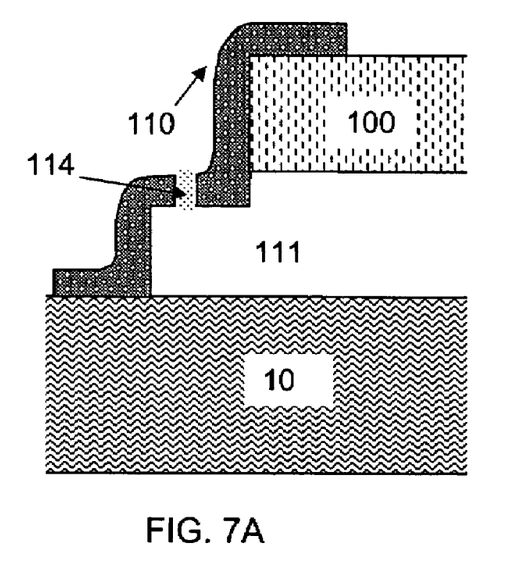
Figure 7B:
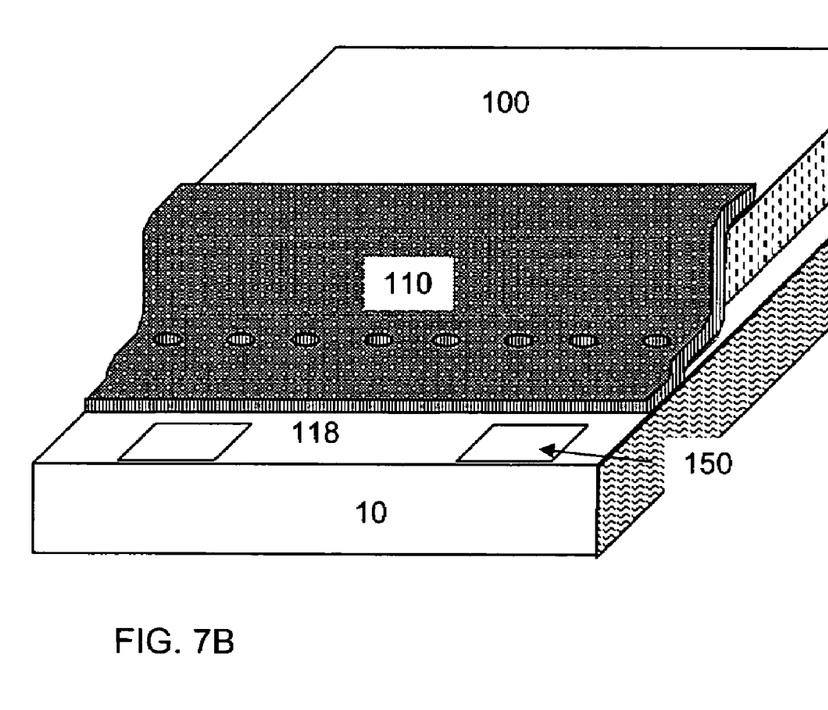

Then a diffusion barrier 110 that is impermeable to moisture and other gases, is deposited to cover the sidewall of the trench 104, part of the cap wafer 100, the shoulder 103, and part of the substrate 10, as shown in cross-sectional view of FIG. 5A and perspective view of FIG. 5B, where the sidewall spacers 170 are not shown. It is patterned to expose bond pads 150 in the gap 118 on the substrate wafer 10 and create window on the cap wafer. The diffusion barrier 110 is preferably a metal, which is deposited by techniques that has good step coverage, such as PVD (physical vapor deposition, sputtering), CVD (chemical vapor deposition), spin coating, and plasma enhanced CVD (PECVD). The diffusion barrier 110 keeps moisture or gas from seeping through the adhesive rings 102 or spacer rings 19 from outside and finding way into the cavity enclosure 200. The diffusion-barrier layer may also comprise a getter layer capable of removing moisture or undesirable gases such as oxygen, hydrogen or hydrocarbons. It is noted that the sealing may be done under vacuum to make the packaging a vacuum.

Figure 8A:
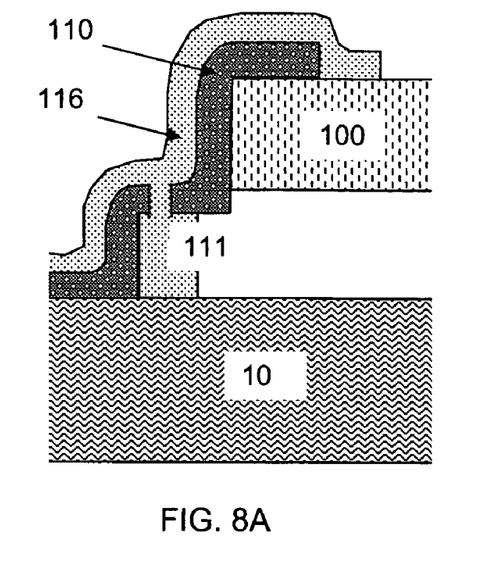
Figure 8B:
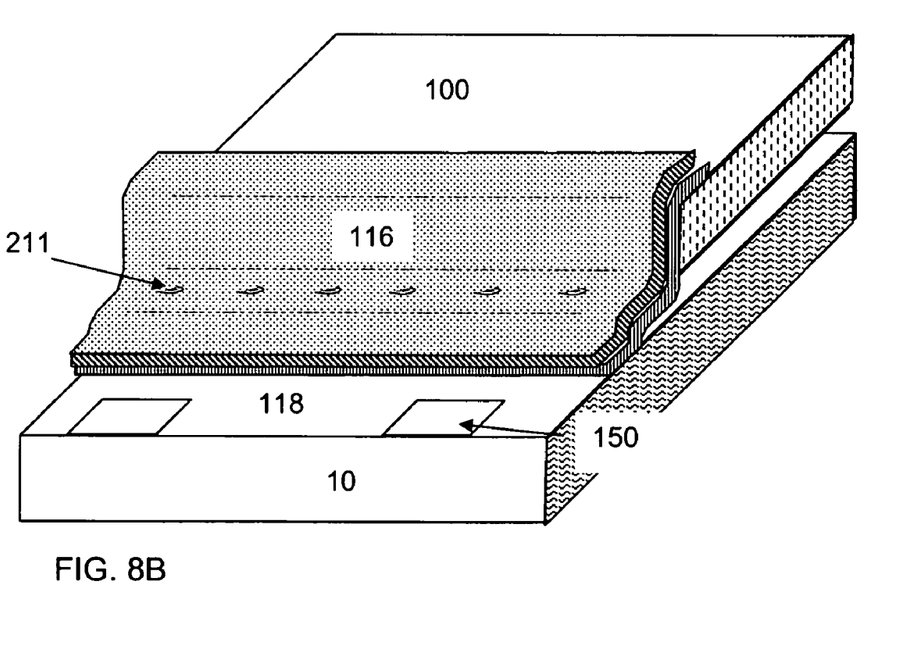
Figure 9A:
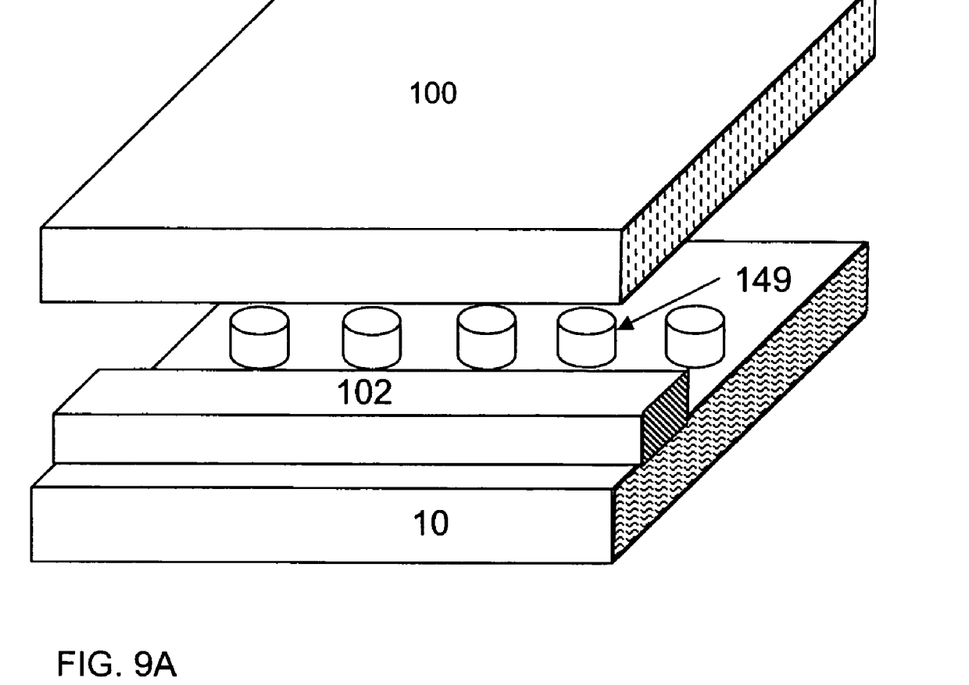
Figure 9B:
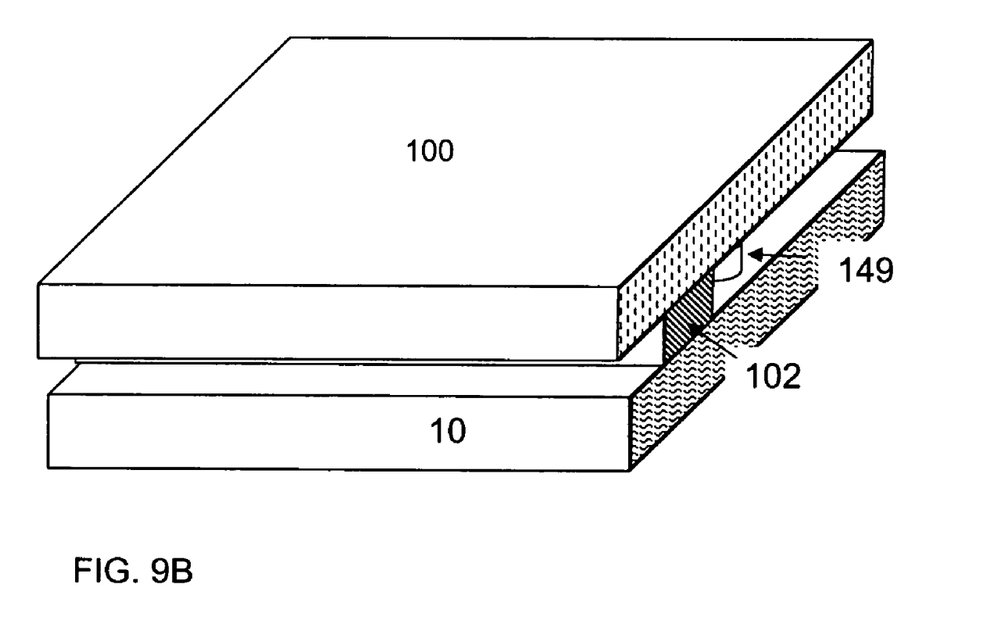

Sometime it may be desirable to remove all or a portion of the adhesive ring in the cavity enclosure 200. The purpose of total removal of the adhesive ring is to prevent outgas of the polymer. This is important if the packaging enclosure is vacuum. The partial removal of adhesive ring can be used to avoid thermal stress from thermal expansion coefficient difference between the polymer ring 102 and the diffusion barrier 110. Additionally, the remnant polymer ring can behave like pillars to support the cap wafer 100. This can be done by the following procedure; referring to FIG. 6A, etch-access holes 114 are patterned and etched in the diffusion barrier 110, preferably on the polymer ring shoulder 103, as shown in cross-sectional views of FIGS. 6A, 6B, and perspective view of FIG. 6C. An isotropic etch is used to etch with undercut to totally or partially remove the adhesive ring 102 through the etch-access holes 114, as shown in cross-sectional view FIG. 7A. Here the diffusion barrier layer 110 is used as structural layer that forms a shell. Now the interior of cavity enclosure 200 is accessible through the etch access holes from the outside. Anti-stiction gas treatment and/or vacuum evacuation, may be introduced through the etch access holes at this point. Next the etch access holes are sealed by depositing an additional diffusion barrier 116 using deposition techniques that have good sidewall coverage, such as plasma-enhanced chemical vapor deposition, sputtering, spin coating, or vacuum evaporation. Cross sectional view of the packaging at this stage of fabrication is shown in FIG. 8A and its perspective view in FIG. 8B. The additional diffusion barrier 116 must be thick enough to plug the etch-access holes. The plugged holes then appear as indentations 211 in the additional barrier 116. Then the individual packaging can be diced from the wafer, to yield individually packaged, hermetically sealed devices. It should be noted that since the additional diffusion barrier 116 is a diffusion barrier, the underlying sidewall diffusion barrier layer 110 functions as a structural layer, which may not be strong enough to support the cap 100. Additional support may be needed to suspend the cap wafer 100, especially when the polymer rings are totally removed. Therefore pillars 149 are formed on the cap 100 or the substrate 10, as shown in FIG. 9A, to act as support. They can be formed by depositing and patterning dielectric or metal layers with a thickness slightly thinner than the adhesive polymer rings. They also act as spacer which sets the spacing between the cap 100 and the substrate 10, as shown in FIG. 9B, during wafer bonding. Then steps described in FIGS. 6 to FIG. 8 can be used to create sealed vacuum cavity enclosures that are resistant to collapse from external pressure.

Figure 10:
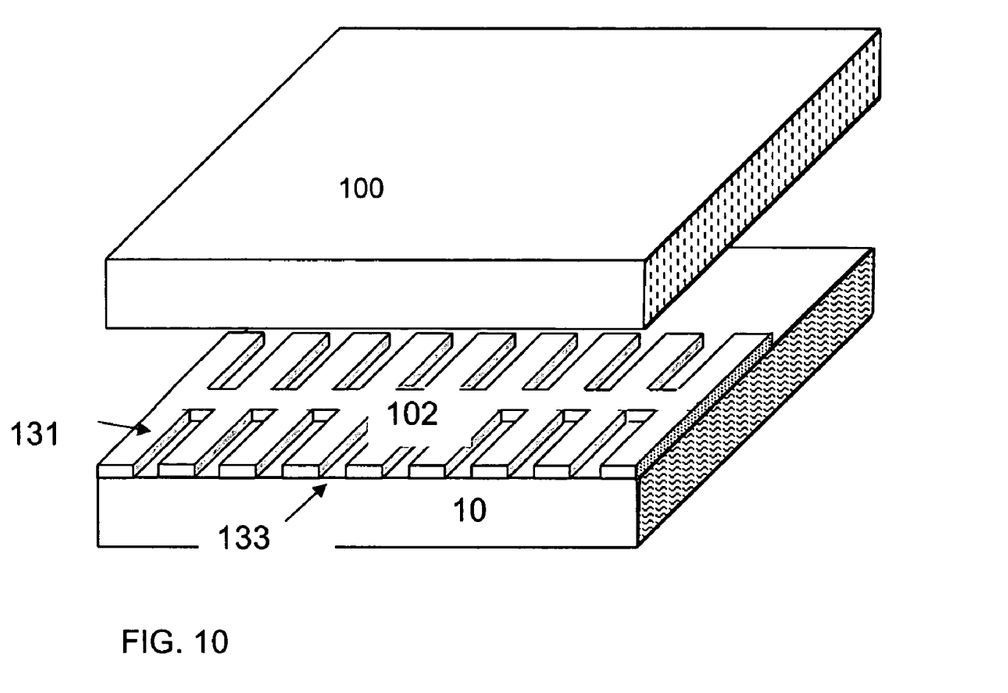
FIGS. 10 through 15 depict cross-sectional side views and their associated perspective views, showing a particular portion of a microstructure during a specific phase of the wafer-level hermetic or vacuum packaging process for a MEMS device.
Figure 11:
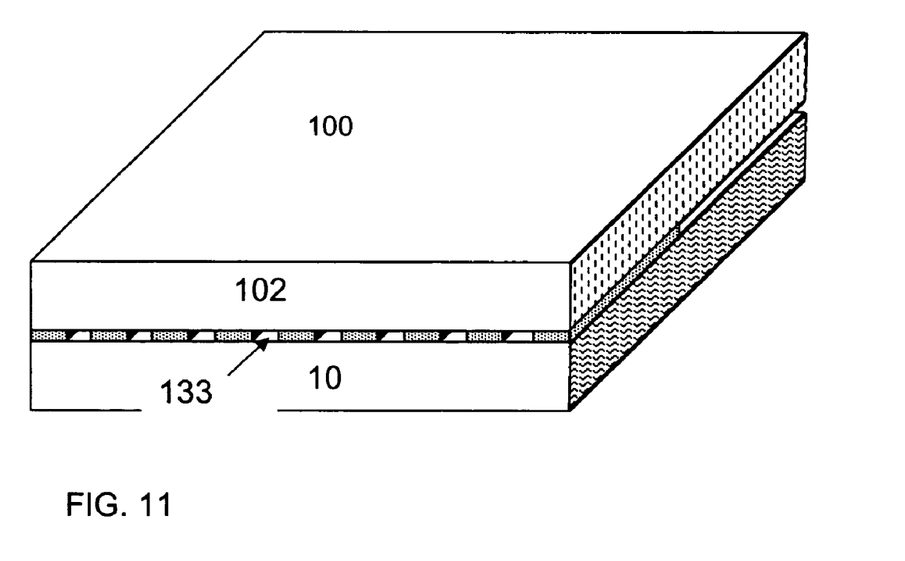
Figure 12:
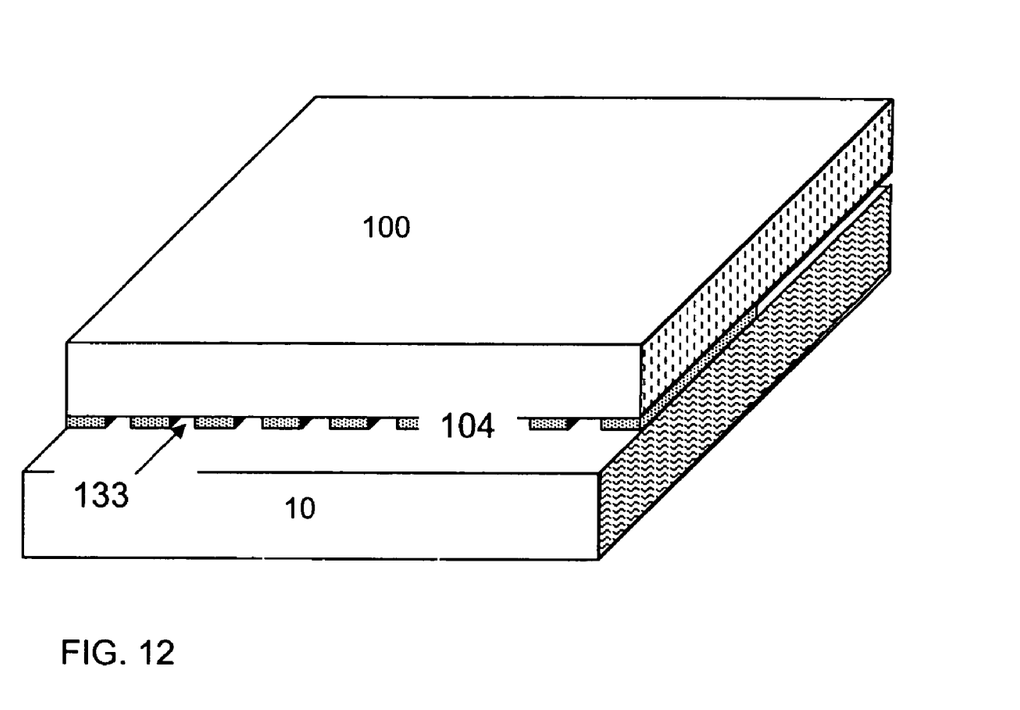
Figure 13:
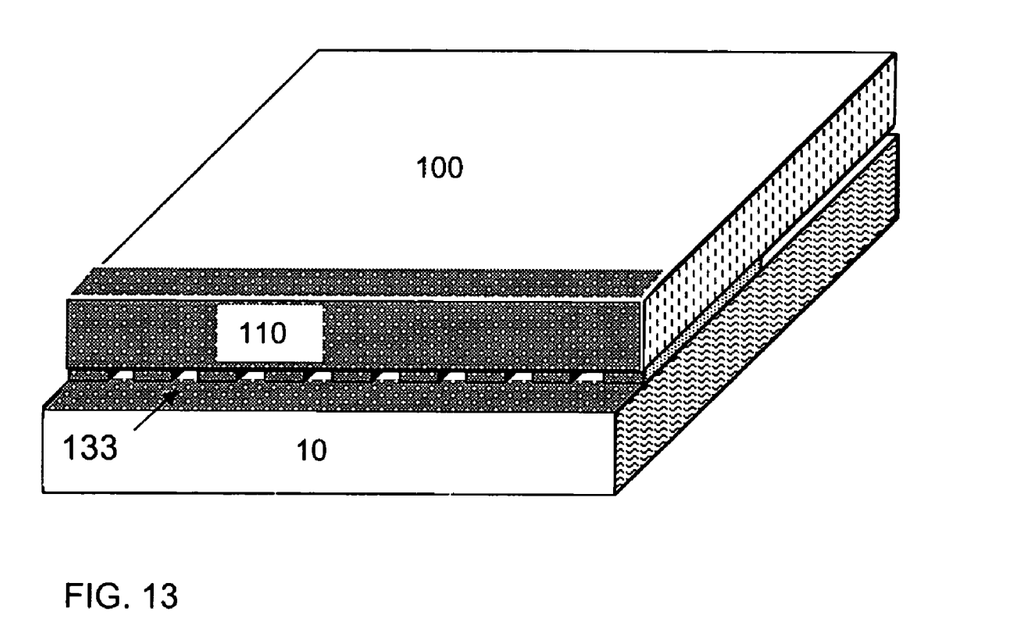
Figure 14:
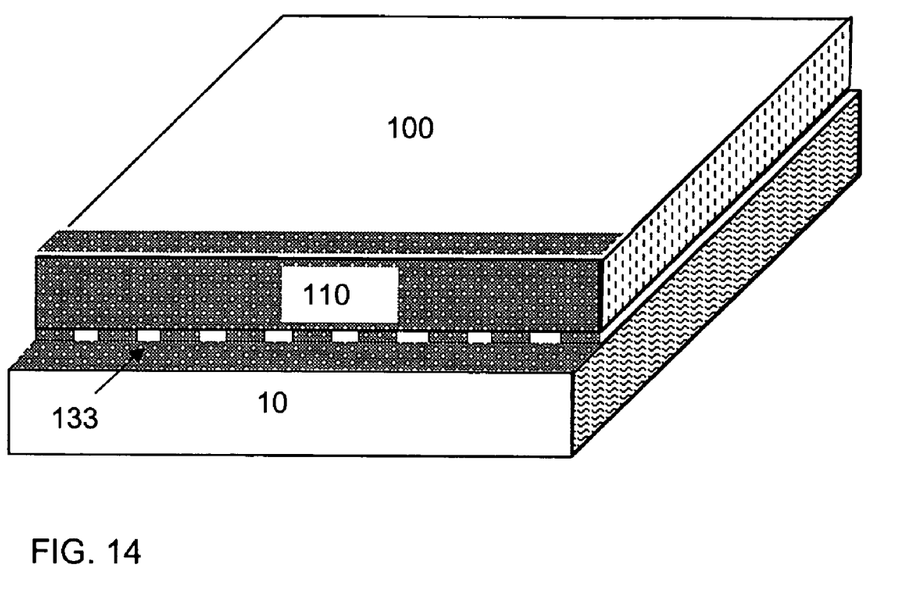
Figure 15:
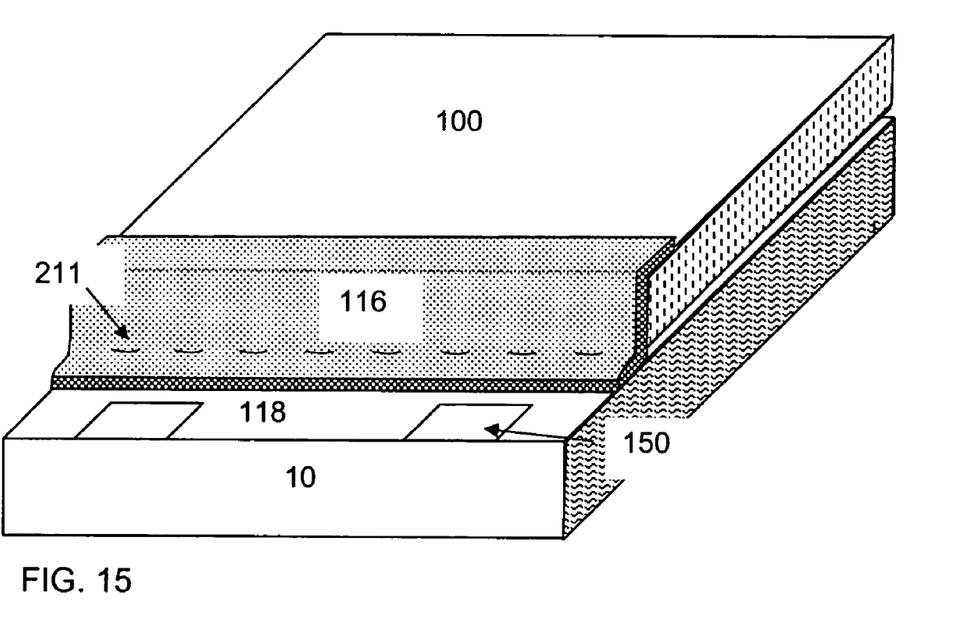

An alternative to patterning and etching etch-access holes 114 is described herein. Referring to perspective views of a small section of the wafer in FIGS. 10 to 15, adhesive rings 102 formed on the cap wafer 100 or substrate 10 comprise combs 131 (FIG. 10) or stripes. Cap wafer 100 is bonded to substrate 10 (FIG. 11) using adhesive rings 102 as spacer as before. Then trenches 104 are formed by etching or sawing as before so that trench sidewall has openings 133 as well as ends of comb fingers, as shown in FIG. 12. A structural layer 110 is deposited to cover the sidewall of comb finger ends (FIG. 13) by CVD, PVD, or spin cast. Openings 133 remain open as the layer 110 is not thick enough to fill them. Thus openings 133 can be used as etch-access holes, through which all or part of adhesive ring 102 can be removed with isotropic etch (FIG. 14). Finally a gas getter and a diffusion barrier 116 can be deposited to seal the etch access holes 133 (FIG. 15). Then the etch access holes appear as indentations 211.

Figure 16:
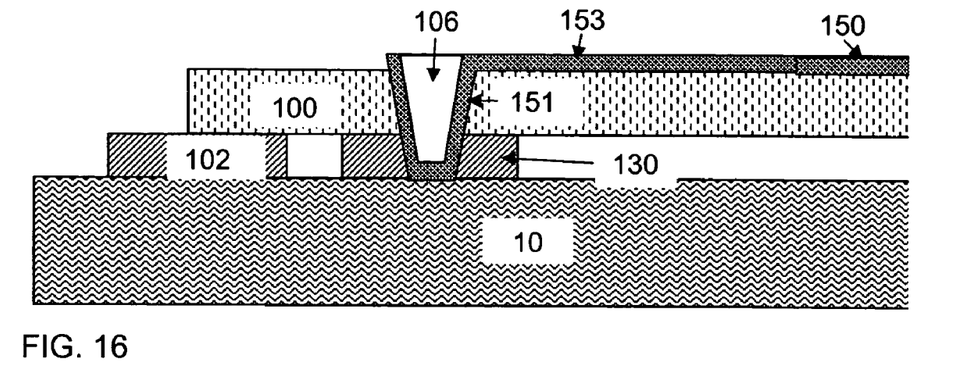
FIG. 16 depicts cross-sectional side view, showing a particular portion of a microstructure during specific phases of the wafer-level packaging process for a MEMS device.
Figure 17:
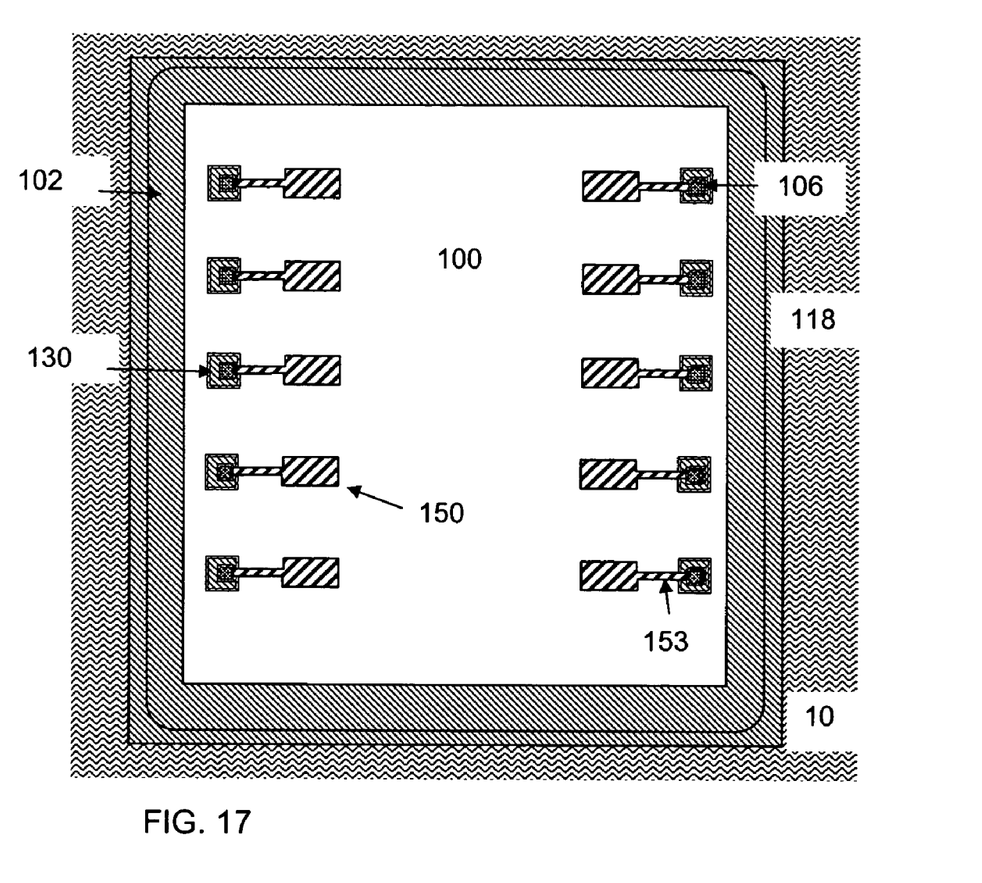
FIG. 17 depicts top views, showing a particular portion of a microstructure during specific phases of the wafer-level packaging process for a MEMS device.

Bond pads needed for wire bonding are normally located in the gaps 118 as shown in FIGS. 3C, 5B, 6C and 15. In the present embodiment, they can be formed on the cap wafer 100 atop the cavity packaging in a 3-D configuration. This saves die area and reduces the stray capacitance. Referring to cross-sectional view of FIG. 16 and top view of FIG. 17, via holes 106 are patterned on the cap wafer 100 to overlap polymer rings 102 and etched (through the cap wafer 100, pillar 130, and/or the polymer rings 102). Metal interconnect 151, bondpads 150 and their leads 153 are then formed by metal deposition with via sidewall coverage, pattering, and etching. Thus the bondpads and interconnect are formed on the cap wafer 100.

The method and system of packaging described hereinabove are applicable to packaging most MEMS devices such as deformable mirror devices (DMD) or TI's DLP™, inertial sensors, and radio frequency switches. Since these small packaging is enclosures or cavities very similar to many MEMS pressure sensors (see, for example, U.S. Pat. No. 6,346,742 Bryzek, et al.), they are suitable for making pressure sensors, wherein the cap wafer is thinned to a flexible membrane and the enclosure is empty.

What is claimed is:

1. A wafer-level cavity packaging, comprising:
   An enclosure on a substrate wafer, with bondpads on the outside of said enclosure, comprising
   a top cover formed from a cap wafer;
   a polymer adhesive ring;
   a bottom formed from said substrate wafer; and
   a deposited diffusion barrier layer formed from a metal or a ceramic;
   wherein said polymer adhesive ring serves as a spacer, an adhesive, and part of the sidewall of said enclosure;
   wherein said adhesive ring bonds the top surface of said substrate to the bottom surface of said cap wafer;
   wherein substantially the entire outer vertical side surfaces of said enclosure including those of said cap wafer and adhesive ring are directly covered by said diffusion barrier;
   wherein said diffusion barrier forms and/or covers a stair outside of said enclosure, wherein the stair comprises at least three stair steps of which a top step is formed from a top edge of said cap wafer, a middle step is formed directly on an outer edge of said polymer adhesive ring, and a lower step is formed from an outer edge of said diffusion barrier directly on a top surface of said substrate wafer;
   wherein said bondpads and the outer vertical side surfaces or edges of said substrate are not covered by said diffusion barrier.

2. The cavity packaging of claim 1, wherein a cross-section of said polymer adhesive ring has an L-shape or a laterally inverted L-shape on each of the two opposing sides, each L-shape side comprising a vertical member and a horizontal member, with an upper surface of the vertical member being bonded to the underside of said cap wafer and an outer edge of the vertical member being flush with a vertical side surface of said cap wafer, and a lower surface of the horizontal member bonded to said substrate.

3. The cavity packaging of claim 2, wherein at least one of said vertical member and said horizontal member have saw marks.

4. The cavity packaging of claim 1, wherein said stair has one additional stair step, wherein outer side surfaces of the cap wafer have vertical and horizontal surfaces and wherein said additional stair step is formed on a horizontal part of the outer side surfaces of the cap wafer.

5. The cavity packaging of claim 4, wherein the horizontal surface and the vertical surface of said addition step have saw marks.

6. The cavity packaging of claim 1, wherein said enclosure further comprises a spacer ring between said cap wafer and said polymer adhesive ring, wherein the outer vertical side surfaces of said cap wafer, said spacer ring, and said polymer adhesive ring are flush with each other.

7. The cavity packaging of claim 6, wherein said spacer ring is an integral part of said cap wafer.

8. The cavity packaging of claim 6, wherein said spacer ring further comprises a plurality of cavities.

9. The cavity packaging of claim 1 further comprising via holes and metal interconnects that go through both said cap wafer and said polymer rings.

10. The cavity packaging of claim 1 wherein said cap wafer comprises at least one cavity.

11. The cavity packaging of claim 1, further comprising a structural layer having etch-access holes below said diffusion barrier layer.

12. The cavity packaging of claim 1, further comprising a plurality of pillars between said cap wafer and said substrate wafer.

13. The cavity packaging of claim 1, wherein said diffusion barrier has a plurality of indentations.

14. The cavity packaging of claim 1, wherein said diffusion-barrier further comprises a gas getter layer.

15. The cavity packaging of claim 1, wherein said cap wafer further comprises a gas getter.

16. The cavity packaging of claim 1, wherein said diffusion barrier layer has through holes in said middle step of said stair wherein said polymer adhesive ring is substantially removed from around said through holes, thereby said cavity is connected to said through holes.

17. The cavity packaging of claim 16, further comprising a getter layer deposited on said middle step, and inside said through holes.

* * * * *